United States Patent [19]
Barnett

[11] Patent Number: 5,756,932
[45] Date of Patent: May 26, 1998

[54] SIGNAL DISTRIBUTION STRUCTURE HAVING LOSSY INSULATOR

[75] Inventor: Ron Barnett, Santa Rosa, Calif.

[73] Assignee: Hewlett-Packard Company, Palo Alto, Calif.

[21] Appl. No.: 690,118

[22] Filed: Jul. 31, 1996

[51] Int. Cl.⁶ .................................................. H05K 9/00
[52] U.S. Cl. ...................... 174/35 R; 174/36; 174/68.1; 174/250; 333/12; 333/81 A; 333/238
[58] Field of Search ................................. 333/12, 81 R, 333/81 A, 181, 238, 246; 174/32, 33, 36, 68.1, 250, 251, 256, 35 R, 35 MS

[56] References Cited

U.S. PATENT DOCUMENTS

| | | | |
|---|---|---|---|
| 2,725,535 | 11/1955 | Grieg et al. | 333/81 A |
| 4,146,854 | 3/1979 | Ishino et al. | 333/181 X |
| 4,796,079 | 1/1989 | Hettiger | 333/12 X |
| 5,528,465 | 6/1996 | Yamate et al. | 174/35 R |
| 5,594,397 | 1/1997 | Uchikoba et al. | 333/81 A X |

OTHER PUBLICATIONS

Data Sheet entitled Cermet Magnetic Coatings; published by Electro-Science Laboratories, Inc., 416 East Church Road, King of Prussia, Pennsylvania 19406-1533 (Undated).

*Primary Examiner*—Paul Gensler
*Attorney, Agent, or Firm*—John L. Imperato

[57] ABSTRACT

A signal distribution structure, or polyline, provides isolation between signal paths in high frequency systems, such as RF or microwave communication systems. The polyline has an inner conductor surrounded by a lossy insulator and a conductive shield. The conductive shield isolates the inner conductor from high frequency signals in the system while the lossy insulator attenuates high frequency signals present on the inner conductor. Low frequency signals on the inner conductor are relatively unattenuated by the polyline. Alternatively, an open polyline is formed in which the conductive shield is absent. The polyline and the open polyline are printed on a ceramic substrate or other type of carrier using known thick-film processing techniques.

3 Claims, 4 Drawing Sheets

SIGNAL DISTRIBUTION STRUCTURE HAVING LOSSY INSULATOR

FIELD OF THE INVENTION

The present invention relates to signal distribution in high frequency systems and, more particularly, to a signal distribution structure for connecting circuit elements, that provides isolation between circuit elements at high frequencies.

BACKGROUND OF THE INVENTION

As the manufacturing cost of integrated circuits (ICs) used in high frequency systems decreases, signal distribution in the systems increasingly influences the system's manufacturing cost. High frequency systems, such as radio frequency (RF) and microwave communication systems, use signal distribution paths to distribute signals and interconnect ICs and other circuit elements within the system's package. The circuit elements generate and process high frequency signals in the system. Low frequency signal paths distribute electrical power and provide control signals to the circuit elements. Isolation between the low frequency signal paths and the high frequency signals may be critical to achieving high performance, while coupling between the low frequency signal paths and high frequency signals may cause crosstalk between circuit elements, degrading performance.

Isolation is achieved using a variety of presently available signal distribution schemes. In one signal distribution scheme, capacitive feedthrus isolate low frequency signal paths from high frequency signals. However, wire bonds and other connections made between the feedthrus and the circuit elements couple to high frequency signals and decrease isolation. To reduce this coupling, shielding structures are milled in the system's package, and feedthrus are positioned at multiple locations in the low frequency signal paths, causing this type of signal distribution scheme to have a high manufacturing cost. In another signal distribution scheme, isolation is achieved by packaging the circuit elements in separate, electrically shielded packages that are connected with coaxial cables. However, the separate packages and coaxial cables also have a high manufacturing cost.

SUMMARY OF THE INVENTION

In accordance with the preferred embodiment of the present invention, a signal distribution structure, or polyline, provides isolation for signal paths in high frequency systems, such as RF or microwave communication systems. The polyline provides high performance and reduces the manufacturing cost of systems. An inner conductor within the polyline distributes DC and low frequency signals in the system. The inner conductor is surrounded by a lossy insulator and a conductive shield to provide isolation between the signal paths and high frequency signals within the system. The conductive shield isolates the inner conductor from high frequency signals, preventing crosstalk between the circuit elements. While DC and low frequency signals are relatively unattenuated by the polyline, high frequency signals present on the inner conductor are attenuated by the lossy insulator. The polyline also dampens resonances in the signal paths, eliminating spurious oscillations.

In an alternative preferred embodiment of the present invention an open polyline structure is formed. The inner conductor of the open polyline is surrounded by a lossy insulator without the conductive shield. The open polyline or the polyline, may be printed on a ceramic substrate or on another type of carrier enabling low frequency signals supplied from a single feedthru to be distributed throughout a system, thus lowering the system's manufacturing cost.

DETAILED DESCRIPTION OF THE PREFERRED EMBODIMENT

Figure 1:
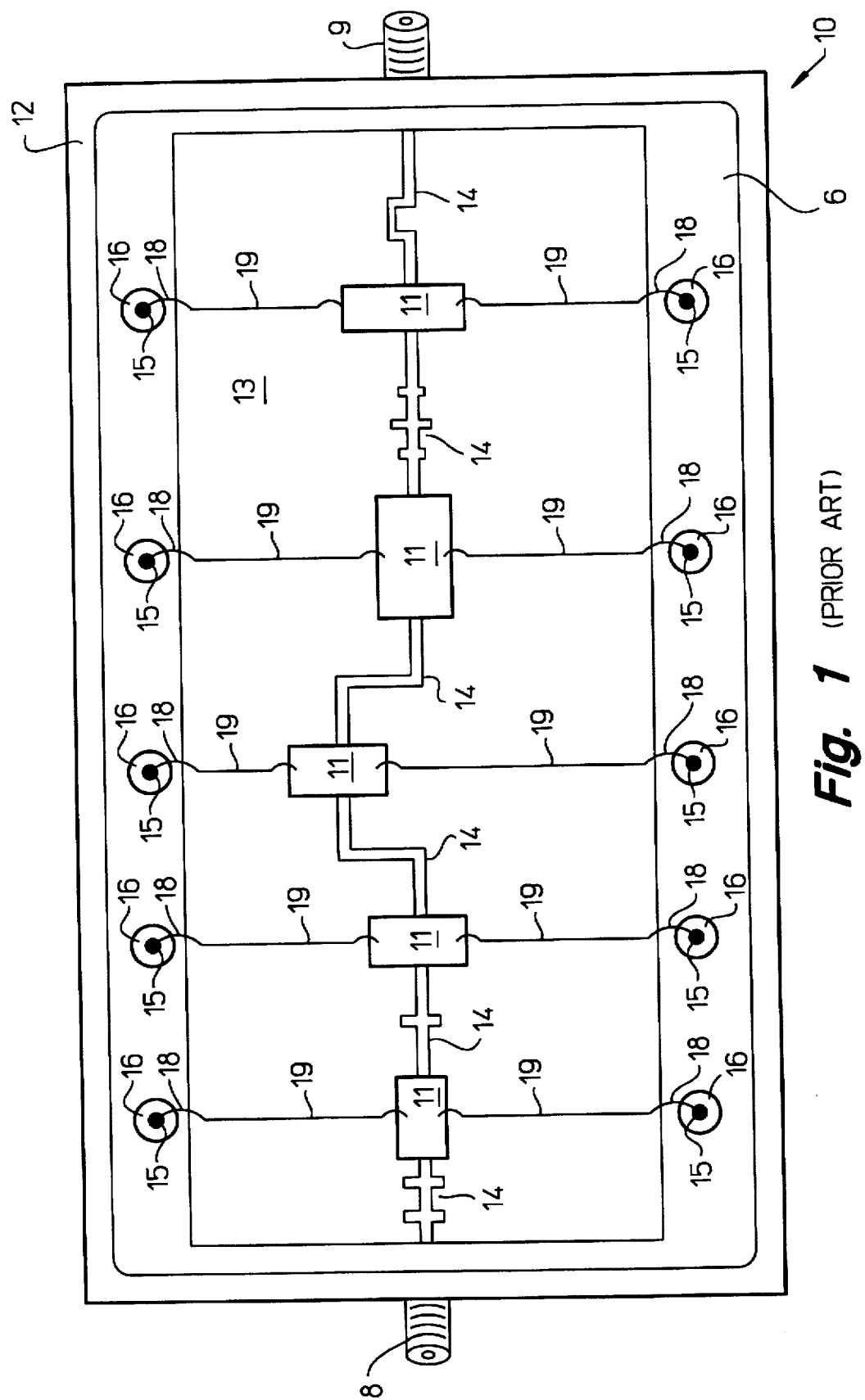
FIG. 1 shows a prior art signal distribution scheme within a high frequency system.

FIG. 1 shows a prior art signal distribution scheme used within a high frequency system 10. The system 10 includes integrated circuits (ICs), discrete devices or other types of circuit elements 11 housed in a package 12, forming a receiver, amplifier, modulator or other type of system 10. Circuit elements 11 are interconnected with microstrip traces 14 on a ceramic circuit 13, to provide high frequency signal paths within the system 10. High frequency signals present on the microstrip traces 14 are typically in the RF or microwave (0.010 GHz to 50 GHz) frequency range.

Feedthrus 16 connect circuit elements 11 to circuitry external to the package 12, such as the system's 10 power supply (not shown) and control circuitry (not shown) for the circuit elements 11. One end of a center pin 15 of the feedthru 16 is external to the package 12 and connects to the external circuitry, while the other end of center pin 15 is internal to the package 12 and connects to a wire bond 18. Wire bonds 18 connect center pins 15 to low frequency signal traces 19 on ceramic circuit 13, which in turn, connect to circuit elements 11. Together, the feedthrus 16, wire bonds 18 and low frequency signal traces 19 form the low frequency signal paths in the system 10. Low frequency signals applied to the center pins 15 are typically within the DC to 0.010 GHz frequency range.

High frequency signals present in the system 10 couple to the low frequency signal paths but are shunted to the package 12, which provides a ground for system 10. These high frequency signals are shunted by coaxial capacitors (not shown) that are internal to each feedthru 16, capacitively coupling center pins 15 to the package 12. Instead of a single feedthru, multiple feedthrus 16 are used for each low frequency signal applied to the low frequency signal paths in the system 10. The multiple feedthrus 16 more effectively shunt high frequency signals which couple to the low frequency signal paths and improve isolation between the low frequency signal paths and the high frequency signals. However, the multiple feedthrus increase the manufacturing cost of the system 10.

Coupling, due to lack of isolation, between the high frequency signals and the low frequency signal paths causes the performance of the system 10 to be unpredictable, and the coupling often degrades the system's performance. High frequency signals enter the package 12 through a coaxial connector at input 8 and couple into a cavity 6 of the package 12. The wire bonds 18, in turn, couple to the high frequency signals in the cavity 6 and enable the high frequency signals to bypass the circuit elements 11 or couple between circuit elements 11 through the low frequency signal paths. The high frequency signals may also couple directly to output 9, degrading system 10's performance. For example, if the system 10 is a pulse modulator and the circuit elements 11 are in the high attenuation state, high frequency signals that bypass the circuit elements and couple to the output 9, significantly degrade the pulse ON/OFF ratio of the pulse modulator. To reduce coupling and achieve isolation between the low frequency signal paths and the high frequency signals, a shield is milled within the package cavity 6, or within the package lid (not shown). However, milling the package 12 or the lid to provide shielding causes this type of signal distribution scheme to have a high manufacturing cost.

In addition to coupling, resonances in the low frequency signal paths cause the performance of the system 10 to be unpredictable, and the resonances may degrade the performance of the system. The wire bonds 18 of each low frequency signal path have inherent inductance which forms L-C resonant circuits with the coaxial capacitors internal to the feedthrus 16. The L-C resonant circuits may cause oscillations in the low frequency signal paths that connect to the circuit elements 11. The oscillations, in turn, may induce spurious oscillations in the high frequency signals present at output 9. To dampen the oscillations caused by the L-C resonant circuits, blocks of iron impregnated rubber, or polyiron, are placed on the low frequency signal traces 19 at empirically determined locations. This added manufacturing step increases the manufacturing cost of the system 10.

The prior art signal distribution scheme is susceptible to coupling and to resonances in the low frequency signal paths. The techniques used to increase isolation and dampen the resonances cause the prior art signal distribution schemes to have high manufacturing cost.

Figure 2:
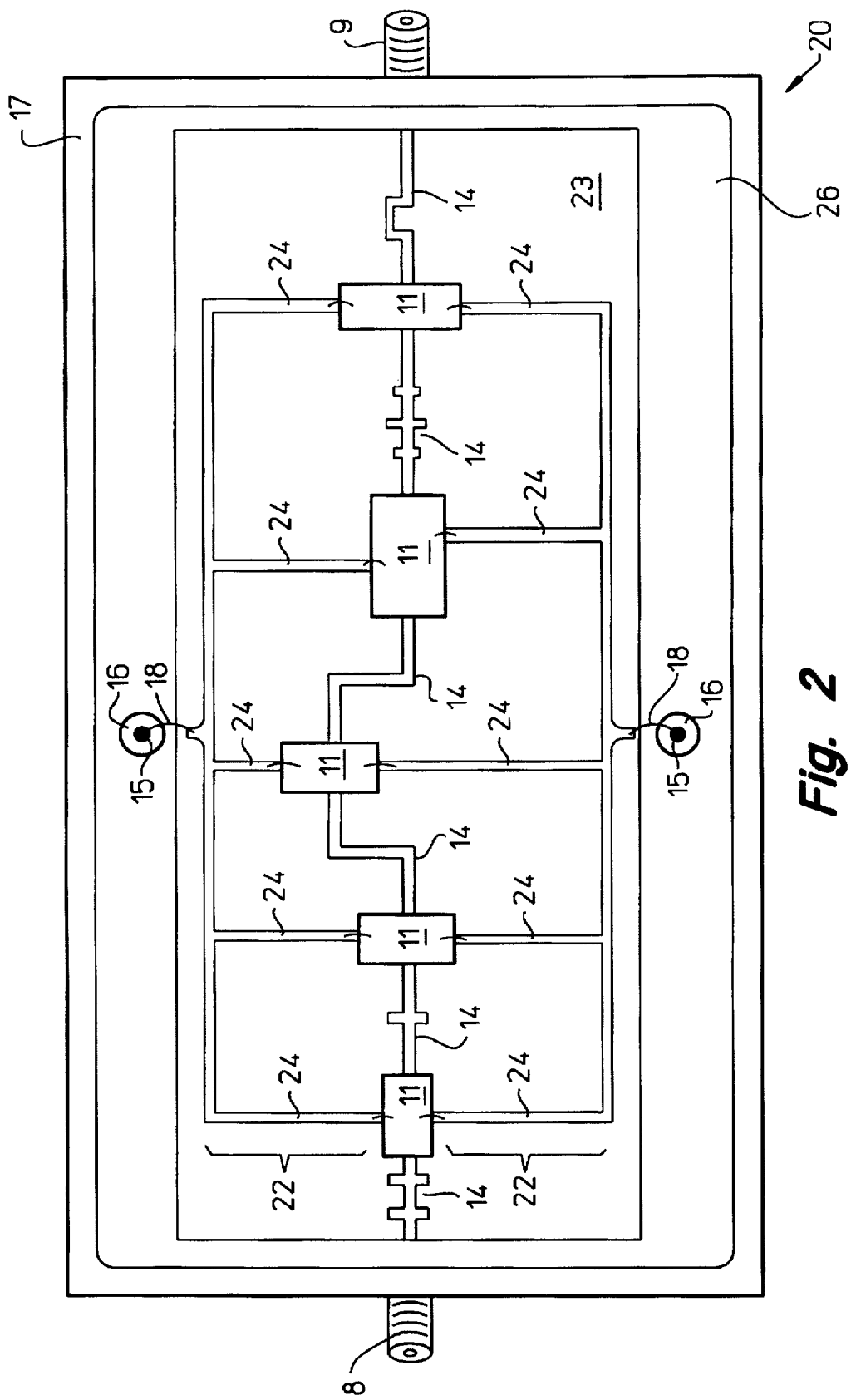
FIG. 2 shows a signal distribution structure, or polyline, constructed according to the preferred embodiment of the present invention.

FIG. 2 shows a signal distribution structure, or polyline 22, within a high frequency system 20, constructed according to the preferred embodiment of the present invention. The polyline 22, wire bonds 18, and feedthrus 16 form signal distribution paths within the system 20, which may be an RF or microwave communication system, or another type of system 20. The polyline 22 isolates the signal distribution paths from the high frequency signals in the system 20. DC and low frequency signals applied to center pins 15 of feedthrus 16 are routed to circuit elements 11 through branches 24 of the polyline 22. High frequency signals applied to input 8 propagate through microstrip traces 14, through circuit elements 11 and then exit package 17 through output 9. High frequency signals couple to the cavity 26 of the package 17 and then to the wire bonds 18, but the high frequency signals are attenuated in the polyline 22. Thus, each branch 24 of the polyline 22 is isolated from high frequency signals. The isolation provided by polyline 22 enables DC and low frequency signals to be applied to the center pin 15 of a single feedthru 16 and to be distributed throughout the system 20. This eliminates the reliance on multiple feedthrus 16 to provide isolation and lowers the manufacturing cost of system 20. Feedthrus 16 are not relied upon to shunt high frequency signals to the package 17, which provides a ground for the system 20, because the polyline 22 provides attenuation to high frequency signals. Other types of interconnections, such as pin grid arrays, may be used in place of the feedthrus 16, or in addition to the feedthrus 16 to interconnect the system 20 to circuitry external to the package 17.

The polyline 22 also dampens resonances on the signal distribution paths, which may be caused by the L-C resonant circuits formed by the coaxial capacitors internal to the feedthrus 16 and the inherent inductance of the wirebonds 18, connecting to the polyline 22. This improves system 20's performance and reduces spurious oscillations in the system. The polyline 22 is readily printed on the ceramic substrate 23 or on another type of carrier and has a low manufacturing cost.

Figure 3A:
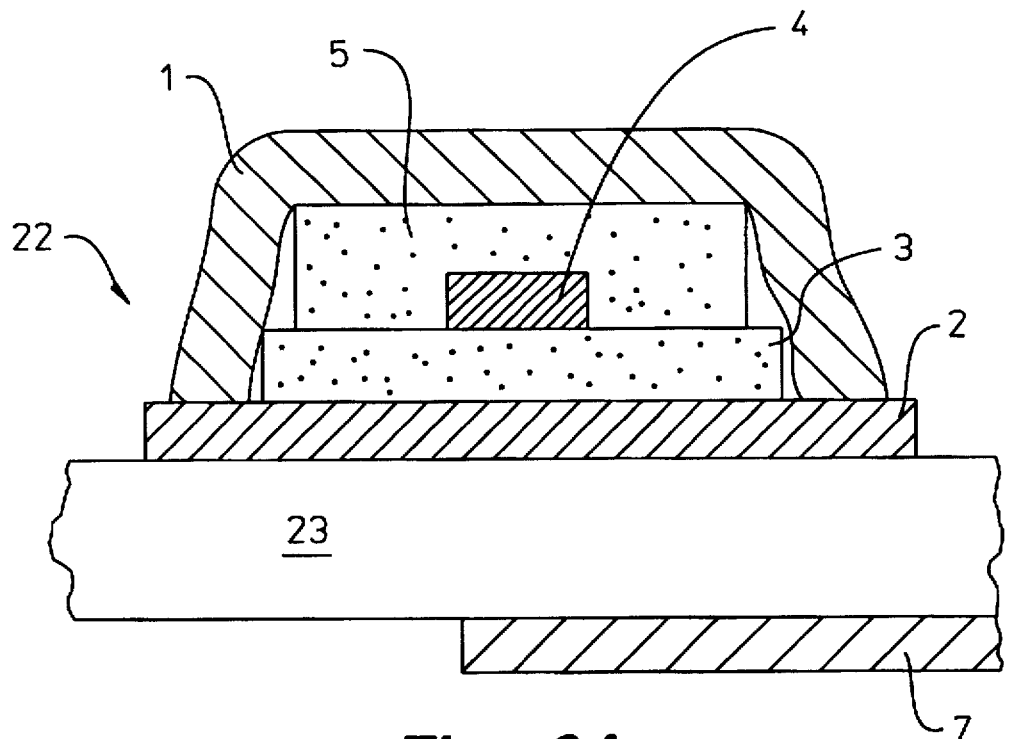
FIG. 3A shows a detailed view of the polyline shown in FIG. 2.

FIG. 3A shows a detailed cross-sectional view of the polyline 22 shown in FIG. 2. The polyline 22 is printed on a substrate 23. The substrate 23 may be fabricated from a variety of materials and, in this example, the substrate is chosen to provide process compatibility with thick-film circuit processing techniques. A 0.040" thick ceramic substrate 23 of 96% Alumina is used. A conductive bottom layer 2, formed from gold paste, is then screened onto the substrate 23. The substrate 23 and the conductive bottom layer 2 are fired in a furnace to cure the gold paste and provide adhesion between the conductive bottom layer 2 and the substrate 23. The resulting conductive bottom layer 2 is 0.003" thick and 0.050" wide. The conductive bottom layer 2 may be connected to a backside ground 7, or other signal trace by conductive via holes (not shown) that protrude through the substrate 23.

A lower insulating layer 3 is formed from iron-ceramic paste or from another dielectric material having iron or other ferromagnetic material embedded in it. An example of an iron-ceramic paste is EX-#2000 Ferromagnetic Paste, available from Electro-Science Laboratories, Inc. The iron-ceramic paste is screened on top of the conductive bottom layer 2 and is also fired to cure the iron-ceramic paste and provide adhesion to the conductive bottom layer 2. The resulting lower insulating layer 3 is 0.002" thick, 0.030" wide and is approximately centered across the width of the bottom layer 2, so as to leave a portion of the conductive bottom layer 2 exposed on each side of the lower insulating layer 3.

An inner conductor 4, also formed from gold paste, is screened on top of the lower insulating layer 3. The inner conductor 4 is then fired to cure the gold paste and to provide adhesion to the lower insulating layer 3. The inner conductor 4 is 0.005" wide and 0.001" thick. The inner conductor 4 is approximately centered across the width of the lower insulating layer 3, so as to leave a portion of the lower insulating layer 3 exposed on each side of the inner conductor 4.

An upper insulating layer 5 is formed from iron-ceramic paste, similar to the lower insulating layer 3. The iron-ceramic paste is screened on top of the inner conductor 4 and fired to cure the iron-ceramic paste and provide adhesion to the inner conductor 4 and the lower insulating layer 3. The resulting upper insulating layer 5 is 0.002" thick, 0.030" wide, and is approximately aligned across the width of the lower insulating layer 3 so as to contact the lower insulating layer 3 on each side of the inner conductor 4, thus encasing the inner conductor 4.

Finally, a conductive top layer 1, formed from gold paste, is screened on top of the upper insulating layer 5. The conductive top layer 1 is fired to cure the gold paste and to provide adhesion to the upper insulating layer 5 and to the conductive bottom layer 2 on each edge of the lower insulating layer 3. The upper insulating layer 5 and the conductive top layer 1 are recessed relative to the inner conductor 4 at the interconnection points to the polyline 22. This enables wire bonds or other types of connections to be made to the inner conductor 4.

Together, the lower insulating layer 3 and the upper insulating layer 5 form a lossy insulator encasing the inner conductor 4. Together, the conductive bottom layer 2 and the conductive top layer 1 form a conductive shield, surrounding the lossy insulator and the inner conductor 4. The conductive shield provided by the conductive bottom layer 2 and the conductive top layer 1 prevent signals from coupling onto the inner conductor 4. The conductive shield may be connected to a backside ground 7, or to the package 17 through conductive via holes in the substrate 23. The ferromagnetic material within the lower insulating layer 3 and upper insulating layer 5 attenuates high frequency signals present on the inner conductor 4. The attenuation, or transmission loss, provided by the lossy insulator provides isolation along the length of the polyline 22 to high frequency signals. The attenuation provided by the lossy insulator also dampens resonances on the signal distribution paths in the system 20.

Figure 3B:
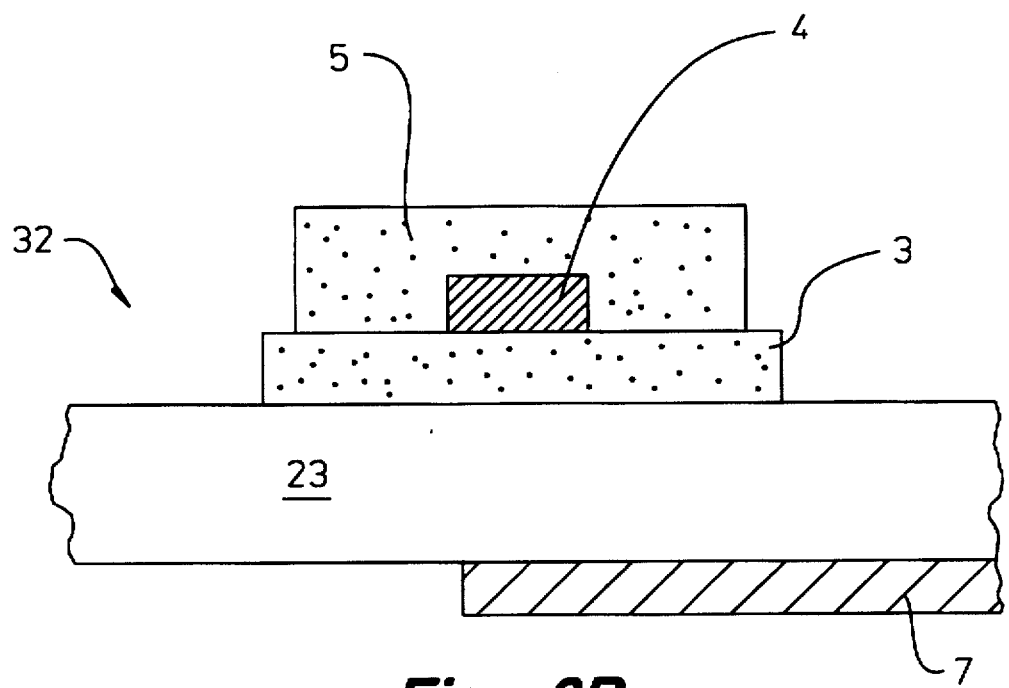
FIG. 3B shows an open polyline, constructed according to an alternate preferred embodiment of the present invention.

Depending on the performance and the manufacturing cost objectives for the system 20, the structure of the polyline 22 may be modified. For example, if the conductive shield is not needed in a system 20, the polyline is constructed with the conductive top layer 1 or the conductive bottom layer 2 absent. FIG. 3B shows an open polyline 32, constructed in accordance with an alternate preferred embodiment of the present invention. The open polyline 32 is formed similarly to the polyline of FIG. 3A, except that the conductive bottom layer 2 and the conductive top layer 1 are absent. The inner conductor 4 of the open polyline 32 is interposed between the lower insulating layer 3 and the upper insulating layer 5, which provide loss, or attenuation, to high frequency signals applied to the inner conductor.

Figure 4:
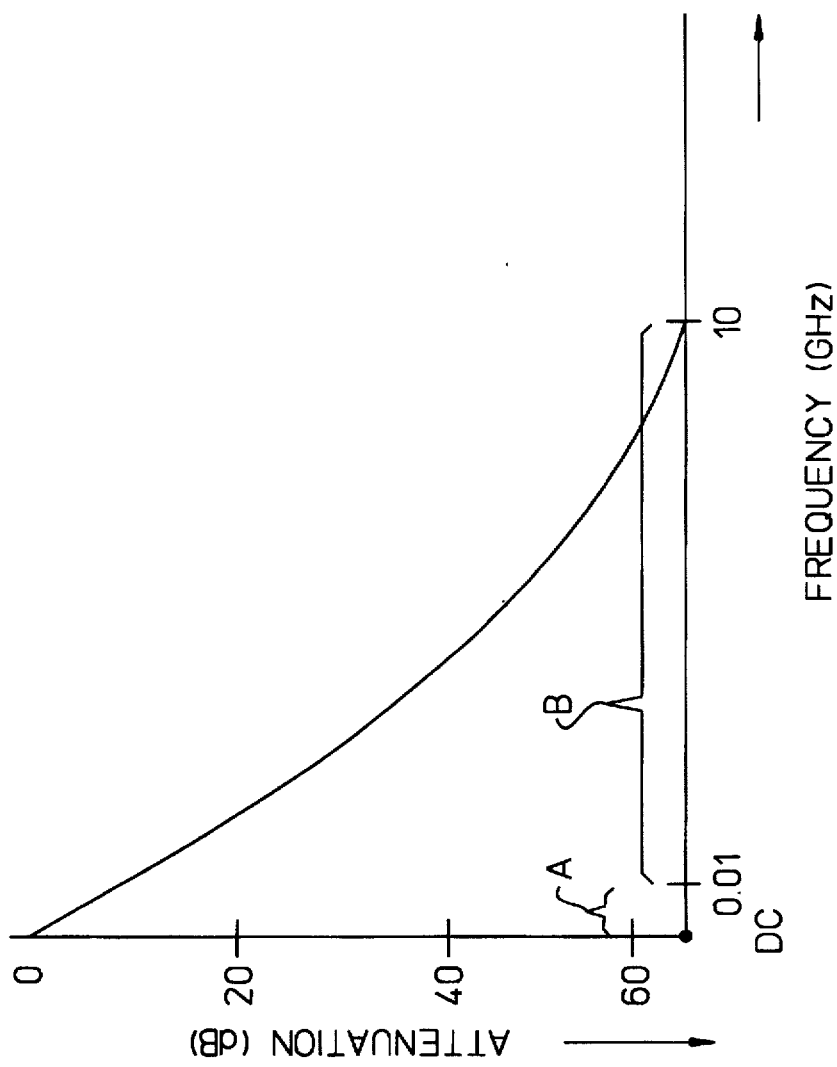
FIG. 4 shows signal attenuation versus signal frequency for the polyline.

FIG. 4 shows signal attenuation, or transmission loss, versus signal frequency for the polyline 22. The plot of FIG. 4 is for a one inch length of the polyline 22. DC and low frequency signals A have low attenuation whereas high frequency signals B are attenuated significantly relative to the DC and low frequency signals A, within a frequency range of interest. The attenuation per unit length of the polyline 22 is adjusted by varying the iron content and permeability of the lower insulating layer 3 or the upper insulating layer 5. The attenuation of the polyline 22 varies according to the length of the polyline 22 and it may be increased by increasing the length of the polyline.

The frequency response, or attenuation versus signal frequency, enables the polyline 22 to be used in a variety of applications, in addition to low frequency signal paths in high frequency systems 20. For example, if used as a signal path connected to the intermediate frequency (IF) port of a mixer, the polyline 22 attenuates high frequency signals and reduces leakage of high frequency signals from the other ports of the mixer. The polyline 22 provides high system performance by providing isolation for the signal paths and by dampening resonances. The polyline 22 is readily integrated into known thick-film processing techniques and has a low manufacturing cost.

What is claimed is:

1. A signal distribution structure, comprising:

an inner conductor for receiving applied signals:

a lossy insulator encasing the inner conductor, the lossy insulator having the property to attenuate signals applied to the inner conductor so that the attenuation increases as the frequency of the applied signal increases within a predefined frequency range:

an outer conductive shield disposed about the lossy insulator: and a dielectric substrate, adhered to the outer conductive shield, the outer conductive shield including a conductive bottom layer deposited on the substrate and a conductive top layer connected to the conductive bottom layers wherein the conductive top layer and the conductive bottom layer are each formed from gold paste.

2. A signal distribution structure, comprising:

an inner conductor for receiving applied signals:

a lossy insulator encasing the inner conductor, the lossy insulator having the property to attenuate signals applied to the inner conductor so that the attenuation increases as the frequency of the applied signal increases within a predefined frequency range:

an outer conductive shield disposed about the lossy insulator: and a dielectric substrate, adhered to the outer conductive shield, the outer conductive shield including a conductive bottom layer deposited on the substrate and a conductive top layer connected to the conductive bottom layer, the lossy insulator including a lower insulating layer deposited on the conductive bottom layer below the inner conductor and an upper insulating layer deposited on the lower insulating layer above the inner conductor, wherein the lower insulating layer and the upper insulating layer are formed from ferromagnetic paste.

3. A signal distribution structure, comprising:

a dielectric substrate;

a lower dielectric insulating layer having ferromagnetic material embedded therein, formed on the substrate and having a predetermined width;

an inner conductor fabricated from gold paste, on the lower insulating layer and having a width less than the width of the lower insulating layer, the inner conductor receiving applied signals;

an upper dielectric insulating layer having ferromagnetic material embedded therein, on the lower insulating layer and the inner conductor, the upper insulating layer having a width greater than the width of the inner conductor:

the lower insulating layer and the upper insulating layer encasing the inner conductor; and the upper insulating layer and the lower insulating layer having the property to attenuate signals applied to the inner conductor such that the attenuation increases as the frequency of the applied signal increases, within a predefined frequency range;

a conductive bottom layer fabricated from gold paste, on the substrate between the substrate and the lower insulating layer, the conductive bottom layer having a width greater than the width of the lower insulating layer; and a conductive top layer fabricated from gold paste on the upper insulating layer wherein the conductive top layer connects to the conductive bottom layer and encases the upper insulating layer and the lower insulating layer.

* * * * *